United States Patent [19]
Morrill

[11] Patent Number: 6,150,845
[45] Date of Patent: Nov. 21, 2000

[54] BUS HOLD CIRCUIT WITH OVERVOLTAGE TOLERANCE

[75] Inventor: David P. Morrill, Portland, Me.

[73] Assignee: Fairchild Semiconductor Corp., South Portland, Me.

[21] Appl. No.: 09/323,868

[22] Filed: Jun. 1, 1999

[51] Int. Cl.[7] .............................................. H03K 19/0185
[52] U.S. Cl. ................. 326/81; 326/80; 326/81; 326/30; 326/31; 326/33; 327/333
[58] Field of Search ................. 326/80, 81, 86, 326/30, 31, 33; 327/333

[56] References Cited

U.S. PATENT DOCUMENTS

| | | |
|---|---|---|
| 5,391,061 | 2/1995 | Davis . |
| 5,432,462 | 7/1995 | Obregòn et al. ........................... 326/21 |
| 5,610,537 | 3/1997 | Hastings ..................................... 326/59 |
| 5,646,553 | 7/1997 | Mitchell et al. ........................... 326/86 |
| 5,828,233 | 10/1998 | Nguyen et al. . |
| 5,914,844 | 6/1999 | Lutley et al. ........................... 361/111 |
| 5,983,320 | 11/1999 | Farmwald et al. ...................... 711/114 |
| 6,049,242 | 4/2000 | Lutley et al. ............................ 327/333 |

*Primary Examiner*—Viet Q. Nguyen
*Attorney, Agent, or Firm*—Pierce Atwood; Chris A. Caseiro

[57] ABSTRACT

A CMOS-based bus-hold circuit having overvoltage tolerance. The bus-hold circuit of the present invention includes, in addition to conventional input and latching inverters, a sense circuit and an arbiter circuit designed in combination to block overvoltage events from powering the latching inverter. The sense circuit includes a comparator designed to compare the potential of a standard high-potential power supply rail to the potential associated with a signal applied to the bus-hold circuit's input node. The higher of those two potentials is used to activate the arbiter circuit that in turn couples the higher of those two signals to a pseudo high-potential power rail. The pseudo high-potential power rail is used to supply power to the latching inverter such that the latching inverter will not be activated during overvoltage conditions, particularly when the circuit is in its high-impedance state. The bus-hold circuit may be similarly designed to establish an undervoltage tolerance as well.

20 Claims, 6 Drawing Sheets

BUS HOLD CIRCUIT WITH OVERVOLTAGE TOLERANCE

BACKGROUND OF THE INVENTION

1. Field of the Invention

The present invention relates to bus hold circuits. In particular, the present invention relates to bus hold circuits established using Complementary Metal Oxide Semiconductor (CMOS) transistor-based technology. More particularly, the present invention relates to CMOS-based bus hold circuits designed to protect against unintended switching or bus coupling caused by overvoltage conditions.

2. Description of the Prior Art

Circuit buses are used to transfer electrical signals of desired amplitude and strength between and among assorted computing and peripheral devices. Circuit buses may connect two or more such devices together either when the devices are proximate to one another or remote from one another. The devices associated with bus interconnections include macro devices such as computers, printers, communications devices, and the like. They also include internal components such as microprocessors, memory cells, etc. Buses are generally simply lines of conductive material that enable rapid signal transfer. However, it is necessary to regulate the signal flow through a bus so that signal exchange and processing may be properly coordinated through the coupled devices. In order to do that, all devices designed to communicate with other coupled devices include bus-interface input and output circuits. These bus-interface circuits are designed to regulate out-going signal transmission to the bus for delivery to another device or devices, and in-coming signal reception from such other devices via the bus.

With a plurality of devices linked to a bus, it is necessary to ensure that only one of those devices has access to the bus at a time in order to avoid the transmission of conflicting signals. All other devices linked to the bus are required to present a high-impedance condition to the bus so that no unintended signal transfer may occur. Thus, to that end, with a system active, a bus-interface circuit must exist in any one of three defined states at any one time. The first state is a first bus-drive condition designed to transfer the equivalent of a logic low signal, the second is a second bus-drive condition designed to transfer the equivalent of a logic high signal, and the third the equivalent of a high-impedance or standby state. The bus-interface circuits designed to regulate signal transfer with the bus are generally known as three-state or tristate buffers.

Figure 1:
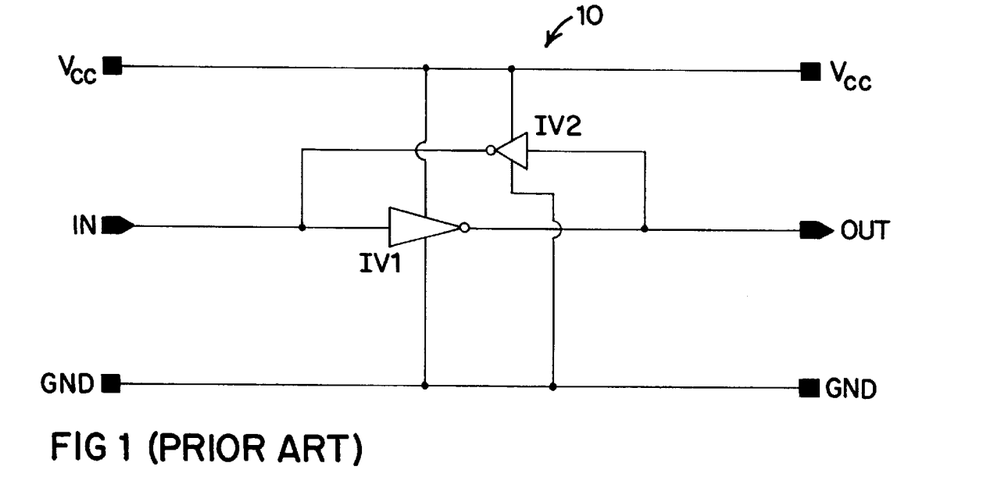
FIG. 1 is a schematic diagram of a prior-art bus-hold circuit with input inverter and feedback latching inverter.

Bus-interface circuits take many forms. In one fairly standard example, the bus-interface circuit is simply an inverter and latch combination designed to receive a signal of sufficient potential for inversion and transmission as shown in the example of FIG. 1. Specifically, the prior-art teaches to couple a latching inverter IV2 in anti-parallel with the input inverter IV1 as shown in FIG. 1 for prior bus-hold circuit 10. High-potential power rail Vcc and low-potential power rail GND power both inverters IV1 and IV2. The latching inverter IV2 is designed to latch the input inverter IV1 in its last driven state when it is in a three-state or "Z" impedance condition thus creating a bus-hold circuit. The incoming signal at IN may be from related circuitry associated with the circuit 10 of a particular device which signal is to be supplied to the bus via node OUT. Alternatively, the signal at IN may be from the bus with the output signal at OUT being delivered to that coupled device circuitry.

Under certain conditions, a signal applied to the input of the bus-interface circuit 10 may be at a potential varying from the potential range under which the inverter is designed to operate. This is an increasing issue as devices of mixed potential ranges are coupled together through a common bus. In certain circumstances, and in particular when the latching inverter IV2 is a CMOS inverter, excess potential at the output node of that inverter can cause a turning on of both CMOS transistors such that significant leakage current will pass between rails Vcc and GND.

It is well known that in digital systems the signals moving between devices are categorized as either logic level high (or "1" or "ON") and logic level low (or "0" or "OFF"). The particular signal potential that defines whether a logic high or a logic low is being transmitted is dependent upon the semiconductor components that form the circuitry associated with that transmission. The most common circuit configurations used to produce digital signals include, among others, CMOS and Transistor-Transistor Logic (TTL). These logic configurations operate differently as a function of the "swing" between what constitutes a logic high signal and what constitutes a logic low signal.

For CMOS logic, which is based primarily on the use of relatively slower, less-power-consuming MOS transistors, a logic low signal is generally developed in the range moving downward from about 0.6 volts (V) above a low-potential power rail GND, which may be at 0.0V. A logic high signal is generally developed in the range of Vcc to Vcc-0.6V, where Vcc may vary between 4.5V and 5.5V for a nominal 5-volt supply, or between 3.0V and 3.6V for a nominal 3.3-volt supply. For a 3.3-volt supply then, the differential swing between low and high must be at least 2.4 volts in order to ensure that a desired shift between a logic low and a logic high will occur. Relatedly, for a system that is 3.3-volt based, a signal received from a device at full-rail 5-volt nominal potential may overwhelm that system. Thus, in mating 5-volt and 3-volt systems, as well as in mating other systems of unequal power supplies, logic potentials outside of the intended range must be accounted for. That is particularly the case for a CMOS-based inverter that is a three-state bus-hold circuit. If the particular inverter is supplied by a 3.3-V high-potential power rail and the input signal to that inverter exceeds the full-rail potential for example, an overvoltage condition occurs and the inverter may be unintentionally activated so as to conduct a signal, or will otherwise conduct current between the high and low power rails as noted in regard to inverter IV2 of FIG. 1.

Figure 2:
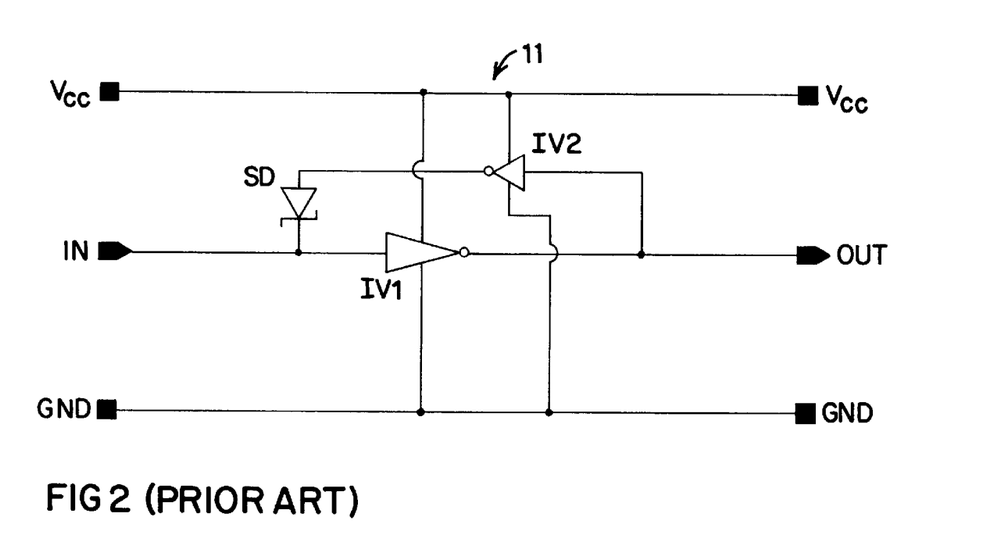
FIG. 2 is a schematic diagram of a prior-art bus-hold circuit with blocking Schottky diode.

The increasing likelihood of overvoltage conditions at the input to the input inverter due to the increase in the coupling of mixed-potential devices requires a solution. Since overvoltage conditions may occur in the bus-hold circuit 10 of FIG. 1, clamping components such as Schottky diode SD have been employed between the output of feedback latching inverter IV2 and input inverter IV1 in second bus-hold circuit 11 shown in FIG. 2. Specifically, when an overvoltage condition occurs at the input IN, the Schottky diode blocks that excess potential from causing a leakage current condition through inverter IV2. When circuit 11 is powered by a relatively lower supply potential, such as 3.3V for example, it can easily be subjected to an overvoltage condition when coupled at IN to a 5-V based device. Since many Schottky diodes have threshold turn-on potentials of about 0.4 V, the drop across that diode pulls down an otherwise logic high potential at the input to IV1 below the nominal 3.3 V potential of Vcc.

Ordinarily, that sort of drop will not significantly affect the operation of the input inverter IV1 in that a full-rail input is only reduced to about 2.9 V-well within the requirements of a 3.3-V based MOS transistor. However, Schottky diodes are fabricated using bipolar transistor fabrication processes. Those processes are more expensive and time-consuming than those associated with CMOS structures, particularly when only a single device is needed as part of a circuit. Therefore, it is preferable to have a CMOS-based structure that includes a means to address the overvoltage condition. Such a device could be a diode-wired MOS transistor. However, the drop across such a device approaches 1.0 V and may therefore cause the potential at the input of IV1 to be less than what is needed for proper operation to trigger either pull up or pull down without simultaneous conduction therethrough. What is needed is a CMOS-only based bus-hold circuit suitable for use in mixed-supply-potential applications.

U.S. Pat. No. 5,828,233 issued to Nguyen et al. describes a CMOS-based bus-hold circuit for use in mixed-signal conditions. Nguyen apparently employs a passive system of MOS transistors that require overvoltages at the input of greater than threshold potential Vt to trigger blocking of the condition. For MOS transistors that Vt is about 0.7 V. Similarly, the input potential must drop below the potential of Vcc by the same Vt potential before the bus-hold circuit begins to respond to the input signal. Clearly, a potential range of about 1.4 V during which bus-hold circuit operation may be ambiguous is unacceptable.

Therefore, what is needed is a CMOS-only bus-hold circuit having an active system for resolving overvoltage conditions, particularly in regard to the coupling of systems of differing supply potentials. What is also needed is such a circuit that is activated to address overvoltage conditions relatively close to the supply potential for the bus-hold circuit. Further, what is needed is such an active circuit that responds to input signal changes with minimal delay subsequent to resolving an overvoltage condition. Such a circuit must further remain effective in all three states of operation during standard potential conditions.

SUMMARY OF THE INVENTION

It is an object of the present invention to provide a CMOS-only bus-hold circuit having an active system for resolving overvoltage conditions, particularly in regard to the coupling of systems of differing supply potentials. It is also an object of the present invention to provide such a circuit that may be activated to address overvoltage conditions relatively close to the supply potential for the bus-hold circuit. It is further an object of the present invention to provide such an active circuit that responds to input signal changes with minimal delay subsequent to resolving an overvoltage condition. The circuit of the present invention remains effective in all three states of operation during standard potential conditions. Further, it may be used to address overvoltage conditions directed from or to the bus. A variant of the tolerant bus-hold circuit of the present invention is an undervoltage tolerant bus-hold circuit for maintaining the circuit in a high-impedance state during undervoltage conditions, if any.

These and other objectives are achieved in the present invention through the coupling of the prior-art latching inverter to a pseudo power rail that is established with a blocking mechanism to prevent overvoltage potentials from reaching the standard high-potential power supply rail. The blocking mechanism includes a sense circuit for determining whether the circuit's input voltage is greater than its high-potential power rail. The sense circuit operates to ensure that the higher potential signal is supplied to the pseudo high-potential rail. That pseudo high-potential rail is in turn coupled to the high-potential node of the feedback latching inverter such that the input potential to that inverter cannot be greater than the potential of its high-potential node.

The sense circuit may preferably be some form of a comparator such as a differential comparator. Use of such a comparator substantially reduces the voltage differential established by the overvoltage that can be blocked by the circuit of the present invention so as to minimize simultaneous conduction or unintended signal transmission. In particular, while the specific triggering potential may be selected, it has been determined that a differential of only about 0.25 V will cause the present invention to become activated for the purpose of blocking the transfer of that overvoltage condition to the high-potential rail of the latching inverter.

The blocking mechanism of the present invention also includes an arbiter circuit for coupling the pseudo high-potential rail to the higher potential signal of either the standard high-potential power rail or the input to the circuit. The arbiter circuit is coupled to the comparator stage of the circuit and selectively activates that circuit branch coupled to the supply node having the greater potential. The result of the coupling of the sense circuit and the arbiter circuit to the prior bus-hold and latching inverters of the prior CMOS bus-hold circuits is that the high-impedance state can be maintained regardless of an overvoltage condition at the input. Similarly, it is to be noted that an undervoltage condition may also be addressed using a blocking mechanism of the type described. However, in that instance, the sense circuit would pass to a pseudo low-potential rail the lower potential of the potentials associated with the standard low-potential power rail and the input to the bus-hold circuit. In that way, the latching circuit will be kept at a high impedance state and no simultaneous conduction will occur through that inverter during an undervoltage condition, should one be experienced.

These and other advantages will become apparent upon review of the following detailed description of the embodiments of the invention, the accompanying drawings, and the appended claims.

DETAILED DESCRIPTION OF THE PREFERRED EMBODIMENTS

Figure 3:
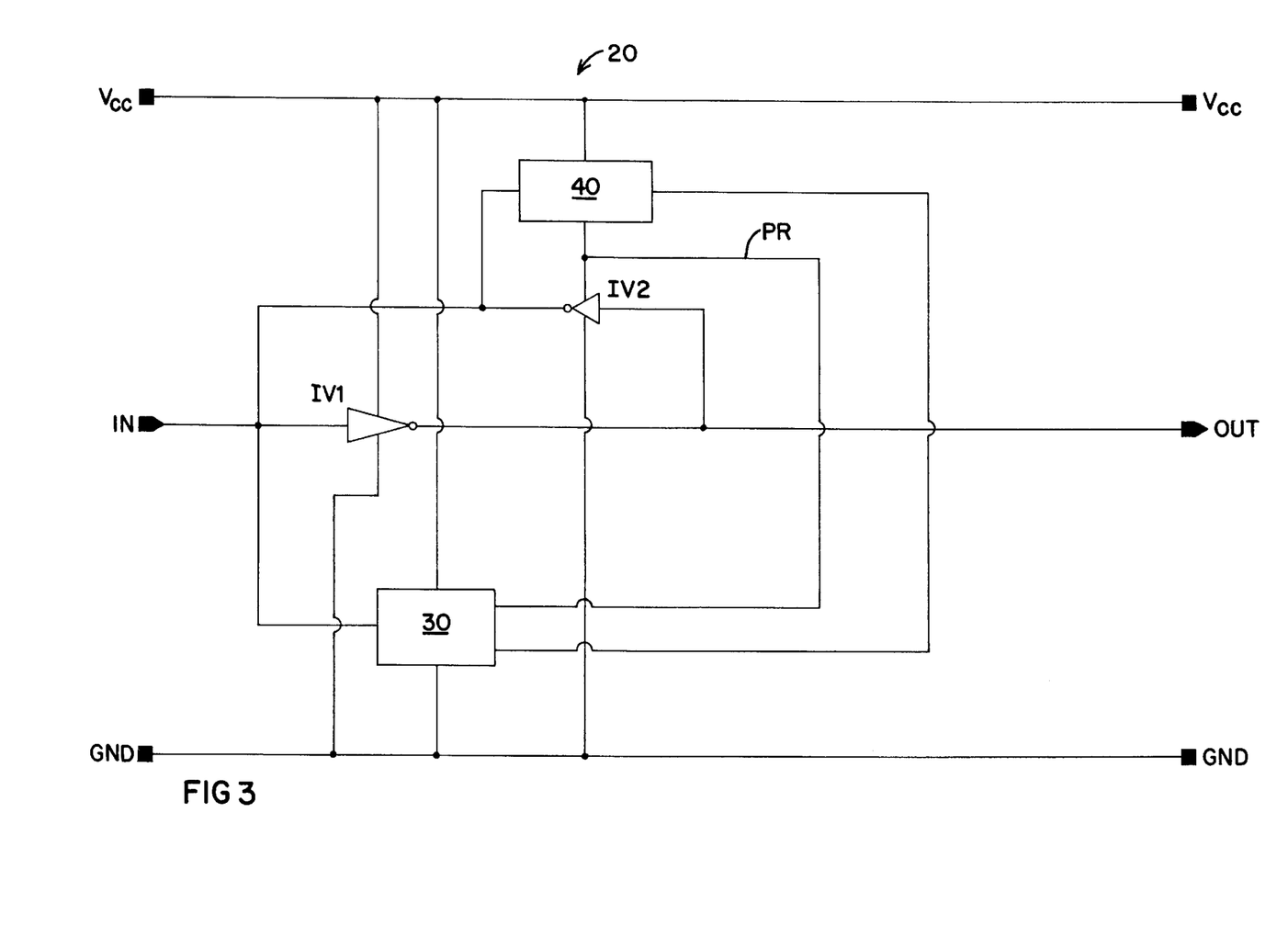
FIG. 3 is a block diagram of the bus-hold circuit of the present invention, showing a sense circuit and an arbiter circuit in an overvoltage tolerant arrangement.

As illustrated in FIG. 3, a bus-hold input circuit 20 of the present invention includes a sense circuit 30 designed to compare the potentials associated high-potential power rail Vcc and the potential applied at input node IN. It is to be noted that node IN may be coupled to a bus for the reception of signals, or to internal circuitry for signal transmission to the bus. Sense circuit 30 is coupled to Vcc and to IN and may preferably include a differential comparator to be described with respect to FIG. 4. The bus-hold circuit 20 further includes arbiter circuit 40 coupled to IN, Vcc, and to sense circuit 30. Arbiter circuit 40 is designed to define the potential associated with a pseudo high-potential rail PR as a function of the output of the sense circuit 30. Specifically, the arbiter circuit 40 couples rail PR to either of Vcc or IN dependent upon which of the two is of a higher potential. The pseudorail PR is in turn coupled to the high-potential node of the latching inverter IV2 so that the potential differential between the input node and high-potential node of inverter IV2 is always fixed so as to block simultaneous conduction. Input inverter IV1 remains operable in the same manner as stated in regard to the prior art.

Figure 4:
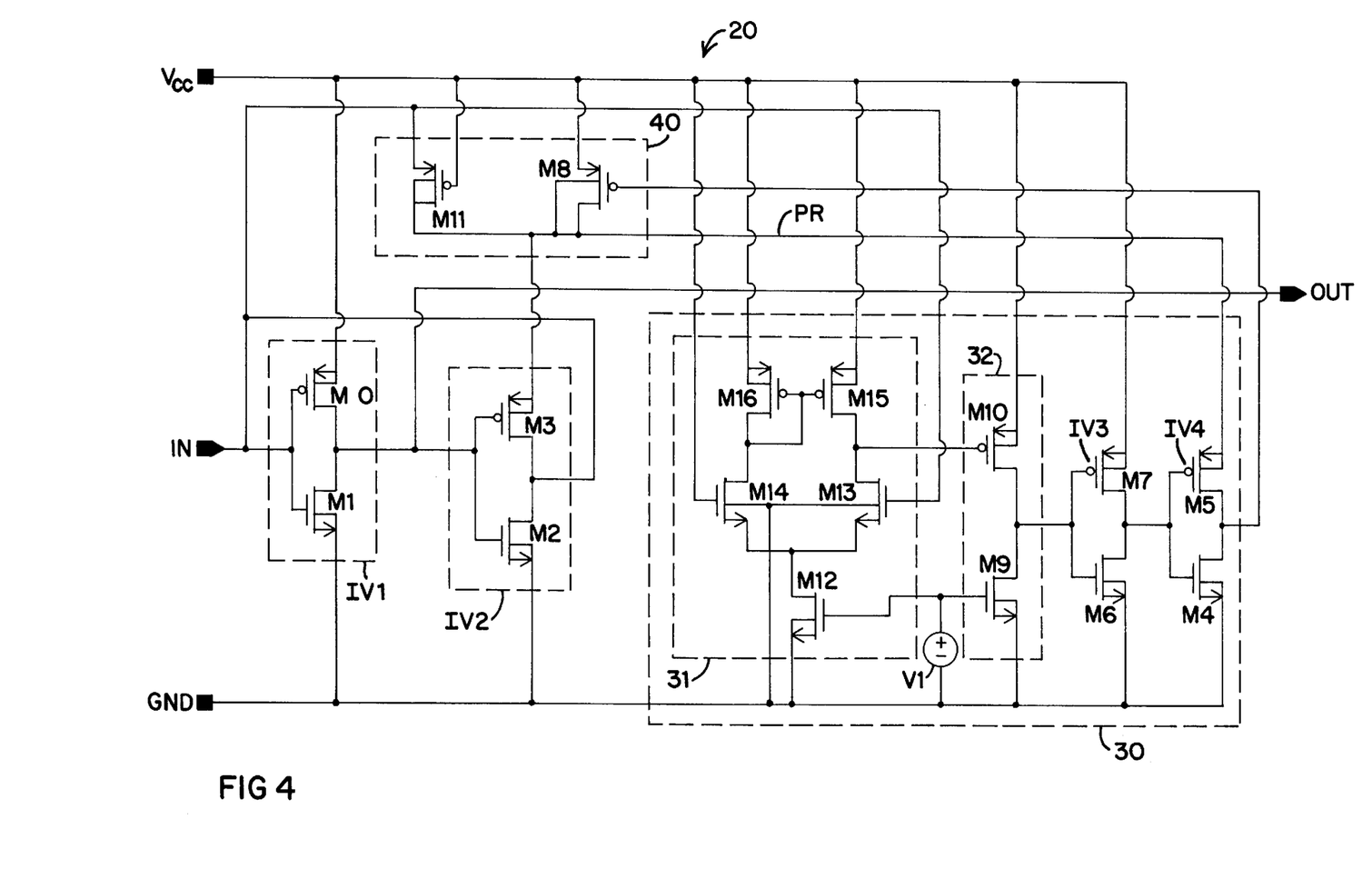
FIG. 4 is a schematic diagram of the CMOS-only bus-hold circuit of the present invention in an overvoltage tolerant arrangement, showing details of the sense circuit and the arbiter circuit.

A preferred detailed design of the bus-hold circuit 20 of the present invention for overvoltage tolerance is shown in FIG. 4. In that structure, input inverter IV1 includes pull-up PMOS transistor M0 and pulldown NMOS transistor M1 having their gates coupled to circuit input IN and their drains coupled to circuit output OUT. The source of M0 is coupled to high-potential power rail Vcc of some defined nominal value, and the source of M1 is coupled to low-potential power rail GND. The drains of M0 and M1 are also coupled to the input of latching inverter IV2 formed of NMOS transistor M2 and PMOS transistor M3. The drains of transistors M2 and M3 are tied back to IN for latching purposes in a manner well know to those skilled in the art. The source of M2 is coupled to GND. Contrary to the design of the prior-art bus-hold circuit 10, the source of transistor M3 is coupled to pseudorail PR rather than directly to Vcc for the purposes stated in regard to FIG. 3.

With continuing reference to FIG. 4, the circuit 20 includes novel sense circuit 30 and arbiter circuit 40 as previously described. Sense circuit 30 includes a comparator 31, a comparator gain stage 32, and optional sense signal inverters IV3 and IV4. The comparator 31 is preferably a differential comparator that is coupled as follows. Always-on tail transistor M12 is coupled to stable independent voltage supply V1 to provide current to the differential comparator. Although supply V1 is something of a current drain, the trade-off in saving the circuit 20 from simultaneous conduction in an overvoltage situation is favorable.

First differential NMOS transistor M13 has its gate coupled to IN such that its operation is defined by the potential at that node. Second differential NMOS transistor M14 has its gate coupled to Vcc such that it is always on. Transistors M13 and M14 have their sources coupled to the drain of always-on supply transistor M12. The drain of transistor M14 is coupled to the gates of PMOS transistors M15 and M16 such that they are always on, each having its gate coupled to Vcc. The drain of transistor M15 is coupled to the drain of transistor M13 while the drain of transistor M16 is coupled to the drain of always-on transistor M14. It is to be noted that the drains of transistors M13 and M15 are also coupled to the comparator gain stage 32 to be described.

Differential PMOS transistor pair M15 and M16 provide the full-rail differential signal output of the circuit 31 as a function of the signals applied by IN to the gate of transistor M13. Specifically, when IN is at a logic high, whether that logic high is at a Vcc or higher potential, transistor M13 is on so as to pull the output of comparator 31 down to a logic low. That output of the comparator 31 is coupled to gain stage 32 including NMOS transistor M9 and PMOS transistor M10. Always-on NMOS transistor M9 ensures that the activation of transistor M10 controls the signal from the comparator 31 in that its gate is tied to that output and its source is coupled to Vcc. Inverter IV3 formed of transistors M6 and M7, has its input coupled to the output of gain stage 32 so as to invert that signal. The source of PMOS transistor M7 is coupled to Vcc and its drain is coupled to the drain of pulldown NMOS transistor M6. Finally, inverter IV4, including pseudorail pull-up transistor M5 and pulldown transistor M4, has its input coupled to the output of IV3 and its output coupled to arbiter circuit 40 in a manner to be described herein. It is important to note that the source of transistor M5 is coupled to the pseudorail PR rather than to Vcc in order to ensure that the arbiter circuit 40 establishes the appropriate higher-potential node coupling to PR.

With continuing reference to FIG. 4, the arbiter circuit 40 acts to tie either of Vcc or IN to the pseudorail PR, pursuant to the design of the sense circuit 30. Specifically, arbiter circuit 40 includes first PMOS arbiter transistor M8 and second PMOS arbiter transistor M11. Transistor M8 has its gate coupled to the output of sense circuit inverter IV4, its source coupled to Vcc, and its drain coupled to PR. Transistor M11 has its gate coupled to Vcc, its source coupled to IN, and its drain coupled to PR. In essence, when transistor M8 is activated, the pseudorail PR is coupled to Vcc during non-overvoltage conditions. When transistor M11 is activated, the pseudorail PR is coupled to IN during overvoltage.

In operation, the bus-hold circuit 20 of the present invention provides overvoltage tolerance in the following manner. While inverters IV1 and IV2 operate in standard fashion during expected on logic low, on logic high, and high impedance states, the remainder of circuit 20 block overvoltage problems. Specifically, transistors M8 and M11 act to pass the input overvoltage at IN to rail PR so as to hold the power supplied to inverter IV2 to the higher of the potential of Vcc and IN. For any high potential input, whether an overvoltage condition or not, the gate of M3 is low, thereby passing any initial overvoltage to PR. Transistors M9/M10 of gain stage 32 and transistors M12–M16 of comparator 31 senses if the potential at IN is greater than at Vcc. That turns on transistor M13 which in turn activates gain transistor M10. A logic high at the input of IV3 produces a logic low at the input of inverter IV4 such that the output of inverter IV4 to the gate of M8 is equivalent to the potential at PR. When the input potential at IN is an overvoltage potential in comparison to the potential of Vcc, transistor M8 is turned off, thereby effectively blocking the coupling of the high-potential node of latching inverter IV2 through pseudorail PR to the lower potential supply rail Vcc. At the same time, during an overvoltage condition of sufficient differential, transistor M11 will be activated so as to couple the pseudorail PR to IN. Finally, during normal operating conditions, the gate of M8 will be driven low, thereby coupling PR to Vcc under suitable conditions.

Figure 5:
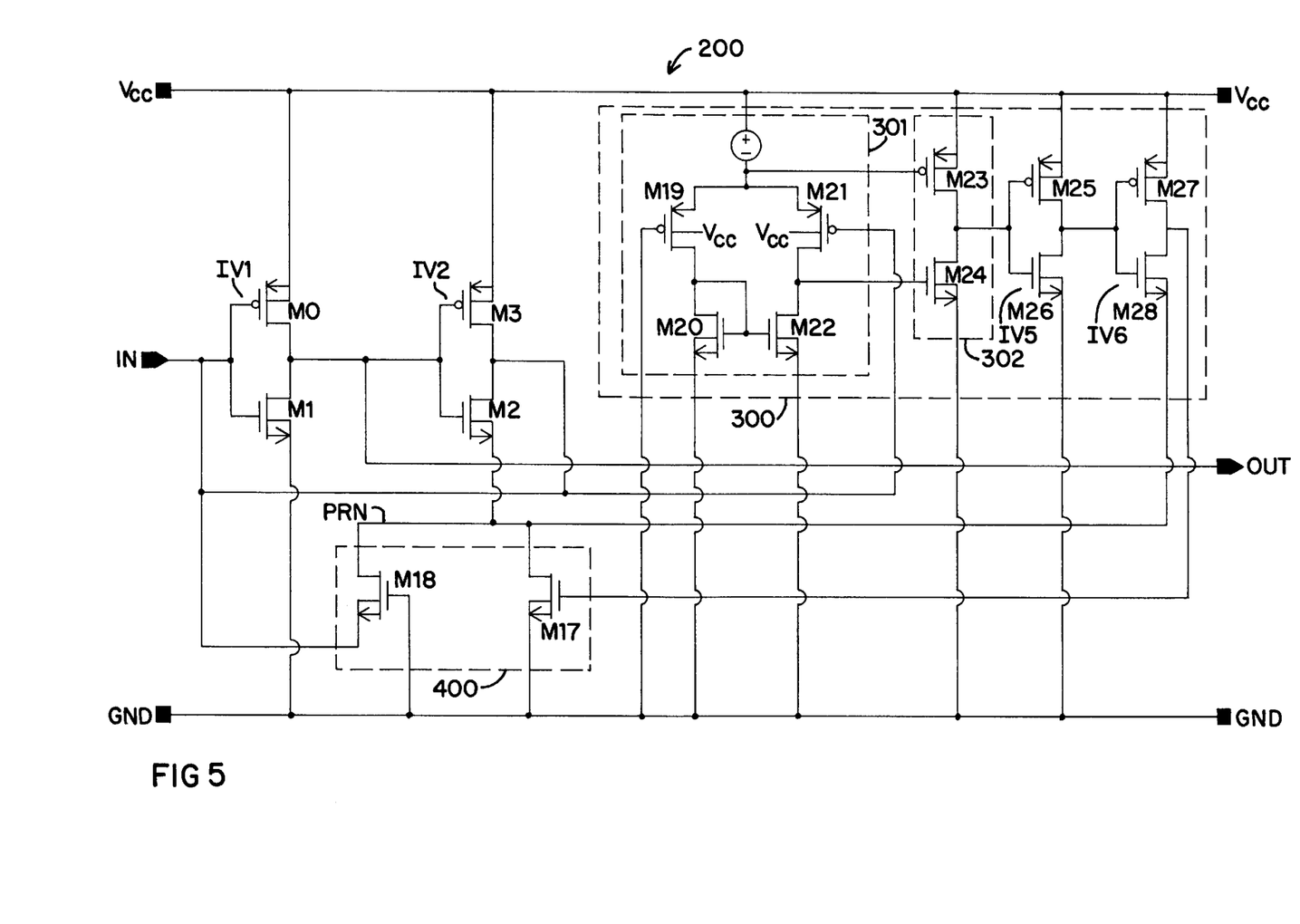
FIG. 5 is a schematic diagram of the CMOS-only bus-hold circuit of the present invention in an undervoltage tolerant arrangement, showing details of the sense circuit and the arbiter circuit.

While the present invention is directed principally to overvoltage tolerance of a bus-hold circuit, it is to be noted that the same characteristics may be applied to protect against undervoltage conditions in suitable circumstances. As illustrated in FIG. 5, bus-hold circuit 200 with undervoltage tolerance includes standard input inverter IV1 and latching inverter IV2 as before. However, in order to protect against an undervoltage condition, the low-potential node of inverter IV2 is coupled through the source of NMOS transistor M2 to pseudo low-potential rail PRN. Rail PRN is coupled to undervoltage sense circuit 300 and to undervoltage arbiter circuit 400 as shown. Specifically, the output of inverter IV6 is coupled to the gate of NMOS blocking transistor M17 such that a logic low output from IV6 blocks the coupling of PRN to GND when the potential at IN is less than the potential associated with low-potential power rail GND. At the same time, transistor M18 couples PRN to IN such that simultaneous conduction will not occur through IV2. In normal operation, the output of IV6 is a logic high, thereby turning on M17 and ensuring that PRN is coupled directly to GND.

The remainder of the circuit operates in a substantially similar but inverted manner to that described in detail in regard to FIG. 4. In summary, sense circuit 300 includes comparator 301 with transistors M19–M22 arranged such that transistor M21 controls the signal applied to gain transistor M24 of gain stage 302. The output from that stage is transmitted to the input of inverter IV5 formed of transistors M25 and M26. The output of inverter IV5 is coupled to the input of inverter IV6 formed of transistors M27 and M28 configured such that the source of NMOS transistor M28 is coupled to the pseudo low-potential rail PRN.

Figure 6:
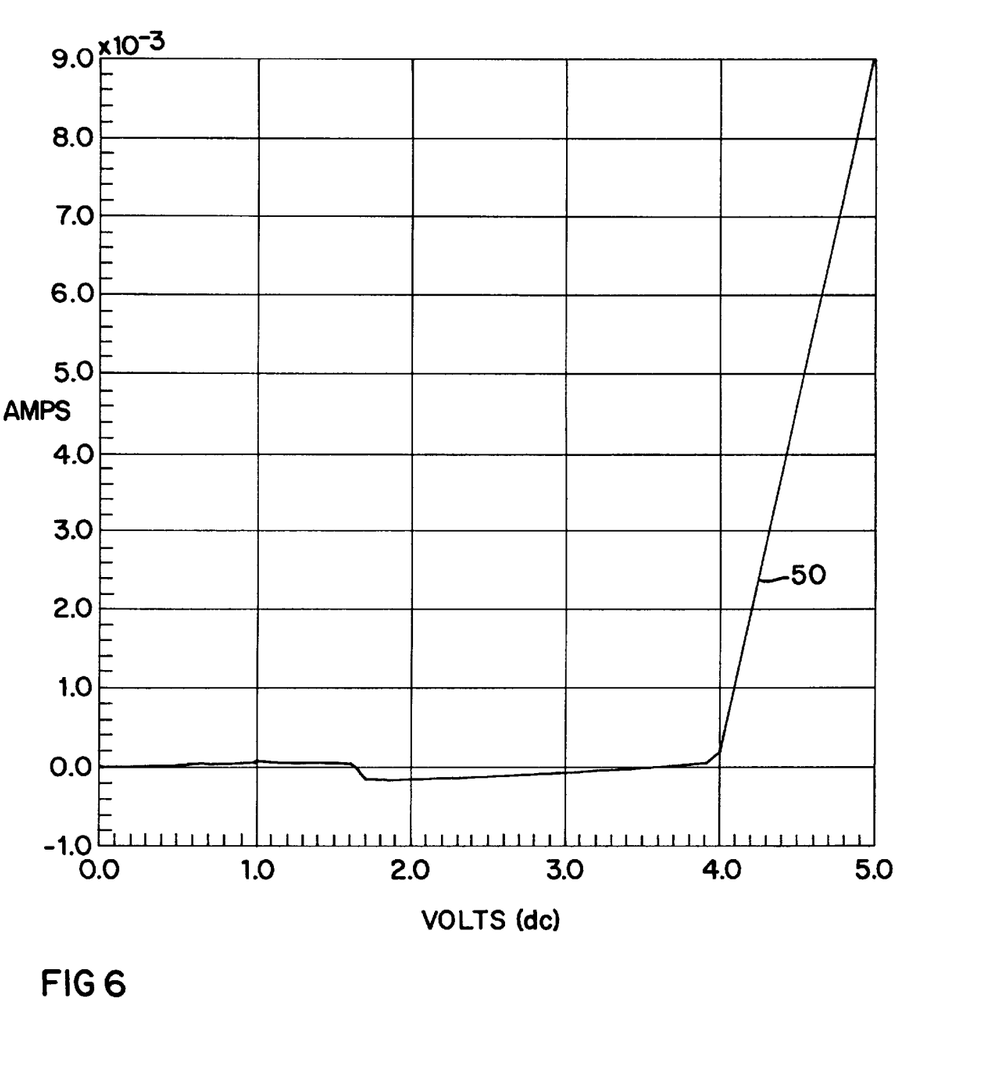
FIG. 6 is a waveform showing the significant leakage current developed through the latching inverter of the prior-art bus-hold circuit of FIG. I during increasing overvoltage conditions.
Figure 7:
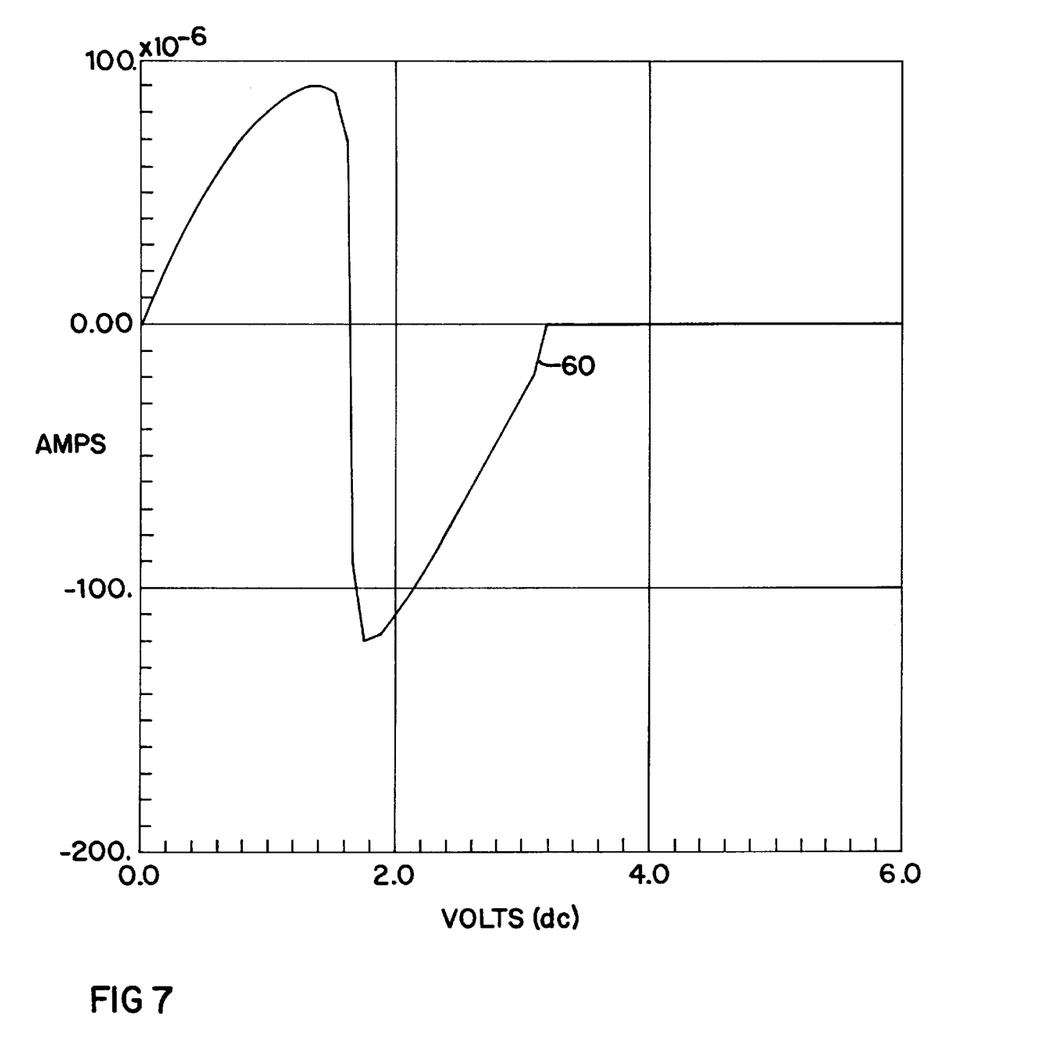
FIG. 7 is a waveform showing the minimal leakage current developed through the latching inverter of the present bus-hold circuit of FIG. 4 during increasing overvoltage conditions.

The advantages of the present invention with regard to the overvoltage tolerant bus-hold circuit 20 of FIG. 4 can be seen in a comparison of the I–V curves for that circuit 20 and the prior-art bus-hold circuit 10 of FIG. 1. Specifically, FIG. 6 illustrates through curve 50 the current through circuit 10 using only inverters IV1 and IV2 in the manner noted when the potential of Vcc is a nominal 3.3 V when the circuit 10 is in a high-impedance state. It can be seen that at about 4 V, the current increases sharply up to about 9 milliamperes when the input potential at IN is about 5 V. The present invention of FIG. 4, on the other hand, provides effective blocking of current through the circuit 20 during overvoltage conditions. As illustrated in FIG. 7 through curve 60, the circuit 20 substantially limits current therethrough when it is supposed to be in the high-impedance state and an overvoltage is applied to the input IN and the high-potential rail Vcc is a nominal 3.3 V. After some very small initial current fluctuation during a signal switch from logic low (0.0 V) to a logic high, there is essentially no current through the circuit as the potential at IN passes beyond 3.3 V. The blocking of the sense circuit 30 in combination with the arbiter circuit 40 coupled to the latching inverter IV2 in the manner shown and described in FIG. 4, can be seen to be particularly effective in comparison to the bus-hold circuit of the prior art.

While the present invention has been described with specific reference to particular embodiments, it is to be understood that all modifications, variants, and equivalents are deemed to be within the scope of the following appended claims.

What is claimed is:

1. An overvoltage tolerant bus-hold circuit designed to operate in three states including a high-impedance state, an input node, and an output node, wherein the bus-hold circuit is a CMOS-based circuit couplable between a high-potential power rail and a low-potential power rail, the circuit comprising:

a. an input inverter having an input coupled to the input node and an output coupled to the output node, wherein said input inverter is powered by the high-potential power rail;

b. a latching inverter having an input coupled to the output node and an output coupled to the input node;

c. a sense circuit coupled to the input node and to the high-potential power rail; and d. an arbiter circuit coupled to said sense circuit and to the input node, wherein said sense circuit and said arbiter circuit selectively establish in combination a pseudo high-potential power rail having a potential that is the higher of either the potential associated with the input node or the potential associated with the high-potential power rail, wherein said pseudo high-potential power rail powers said latching inverter.

2. The bus-hold circuit as claimed in claim 1 wherein said sense circuit includes:

a. a comparator circuit having a first input coupled to the high-potential power rail and a second input coupled to the input node;

b. a gain stage having an input coupled to an output of said comparator circuit; and c. an inverter stage having an input coupled to an output of said gain stage and an output coupled to an input of said arbiter circuit.

3. The bus-hold circuit as claimed in claim 2 wherein said comparator circuit includes:

a. a first NMOS transistor having a gate as said first input of said comparator circuit;

b. a second NMOS transistor having a gate as said second input of said comparator;

c. a first PMOS transistor having a gate and a drain coupled to a drain of said first NMOS transistor and its source coupled to the high-potential power rail; and d. a second PMOS transistor having a gate coupled to said drain of said first NMOS transistor, a source coupled to the high-potential power rail, and a drain coupled to a drain of said second NMOS transistor.

4. The bus-hold circuit as claimed in claim 3 wherein said gain stage includes a PMOS transistor having a gate coupled to said drain of said second NMOS transistor of said comparator circuit and a source coupled to the high-potential power rail.

5. The bus-hold circuit as claimed in claim 4 wherein said inverter stage includes:

a. a first inverter including an input node coupled to a drain of said PMOS transistor of said gain stage and a PMOS transistor having a source coupled to the high-potential power rail; and b. a second inverter, wherein an output of said first inverter is coupled to an input of said second inverter, wherein said second inverter includes a PMOS transistor coupled to said pseudo high-potential power rail, and wherein an output of said second inverter is coupled to said arbiter circuit.

6. The bus-hold circuit as claimed in claim 5 wherein said arbiter circuit includes:

a. a first PMOS transistor having a gate coupled to said output of said second inverter of said sense circuit, a source coupled to the high-potential power rail, and a drain coupled to said pseudo high-potential power rail; and b. a second PMOS transistor having a gate coupled to the high-potential power rail, a source coupled to the input node, and a drain coupled to said pseudo high-potential power rail.

7. An undervoltage tolerant bus-hold circuit designed to operate in three states including a high-impedance state, an input node, and an output node, wherein the bus-hold circuit is a CMOS-based circuit couplable between a high-potential power rail and a low-potential power rail, the circuit comprising:

a. an input inverter having an input coupled to the input node and an output coupled to the output node, wherein said input inverter is powered by the high-potential power rail;

b. a latching inverter having an input coupled to the output node and an output coupled to the input node;

c. a sense circuit coupled to the input node and to the low-potential power rail; and d. an arbiter circuit coupled to said sense circuit and to the input node, wherein said sense circuit and said arbiter circuit selectively establish in combination a pseudo low-potential power rail having a potential that is the lower of either the potential associated with the input node or the potential associated with the low-potential power rail, wherein said pseudo low-potential power rail is coupled to said latching inverter.

8. The bus-hold circuit as claimed in claim 7 wherein said sense circuit includes:

a. a comparator circuit having a first input coupled to the low-potential power rail and a second input coupled to the input node;

b. a gain stage having an input coupled to an output of said comparator circuit; and c. an inverter stage having an input coupled to an output of said gain stage and an output coupled to an input of said arbiter circuit.

9. The bus-hold circuit as claimed in claim 8 wherein said comparator circuit includes:

a. a first PMOS transistor having a gate as said first input of said comparator circuit;

b. a second PMOS transistor having a gate as said second input of said comparator;

c. a first NMOS transistor having a gate and a drain coupled to a drain of said first PMOS transistor and its source coupled to the low-potential power rail; and e. a second NMOS transistor having a gate coupled to said drain of said first PMOS transistor, a source coupled to the low-potential power rail, and a drain coupled to a drain of said second PMOS transistor.

10. The bus-hold circuit as claimed in claim 9 wherein said gain stage includes an NMOS transistor having a gate coupled to said drain of said second PMOS transistor of said comparator circuit and a source coupled to the low-potential power rail.

11. The bus-hold circuit as claimed in claim 10 wherein said inverter stage includes:

a. a first inverter including an input node coupled to a drain of said NMOS transistor of said gain stage and an NMOS transistor having a source coupled to the low-potential power rail; and b. a second inverter, wherein an output of said first inverter is coupled to an input of said second inverter, wherein said second inverter includes an NMOS transistor coupled to said pseudo low-potential power rail, and wherein an output of said second inverter is coupled to said arbiter circuit.

12. The bus-hold circuit as claimed in claim 11 wherein said arbiter circuit includes:

a. a first NMOS transistor having a gate coupled to said output of said second inverter of said sense circuit, a source coupled to the low-potential power rail, and a drain coupled to said pseudo low-potential power rail; and b. a second NMOS transistor having a gate coupled to the low-potential power rail, a source coupled to the input node, and a drain coupled to said pseudo low-potential power rail.

13. A bus-hold circuit designed in three states including a high-impedance state, wherein the bus-hold circuit is a CMOS-based circuit including an input node and an output node, and is couplable between a high-potential power rail and a low-potential power rail, the circuit comprising:

a. a latching inverter having an input coupled to the output node and an output coupled to the input node;

b. a sense circuit coupled to the input node; and c. an arbiter circuit coupled to said sense circuit and to the input node, wherein said sense circuit and said arbiter circuit selectively establish in combination a pseudo power rail to power said latching inverter, wherein any potential at the input node in excess of the potential of either the high-potential power rail or the low-potential power rail is the potential of said pseudo power rail.

14. The bus-hold circuit as claimed in claim 13 wherein said sense circuit is coupled to the high-potential power rail and wherein said pseudo power rail is a pseudo high potential power rail having a potential that is the higher of either the potential associated with the input node or the potential associated with the high-potential power rail.

15. The bus-hold circuit as claimed in claim 13 wherein said sense circuit is coupled to the low-potential power rail and wherein said pseudo power rail is a pseudo low potential power rail having a potential that is the lower of either the potential associated with the input node or the potential associated with the low-potential power rail.

16. A process to control a bus-hold circuit capable of operating in three states including a high-impedance state, wherein the bus-hold circuit is a CMOS-based circuit including an input node and an output node, and is couplable between a high-potential power rail and a low-potential power rail, the process comprising the steps of:

a. providing a latching inverter between the input node and the output node;

b. sensing a potential associated with the input node and with the high potential power rail and the low potential power rail; and c. selecting a potential in excess of the potential of either of the high-potential power rail and the low-potential power rail to establish a pseudo power rail to power said latching inverter.

17. The process as claimed in claim 16 wherein the step of sensing a potential includes the step of sensing a potential associated with the input node and a potential associated with the high-potential power rail and the step of selecting a potential includes the step of directing to said pseudo power rail the higher of the potential associated with the input node and the potential associated with the high-potential power rail.

18. The process as claimed in claim 16 wherein the step of sensing a potential includes the step of sensing a potential associated with the input node and a potential associated with the low-potential power rail and the step of selecting a potential includes the step of directing to said pseudo power rail the lower of the potential associated with the input node and the potential associated with the low-potential power rail.

19. A computer system including one or more circuit buses, wherein one or more of the one or more circuit buses includes coupled thereto a bus-hold circuit designed to operate in three states including a high-impedance state, wherein the bus-hold circuit is a CMOS-based circuit including an input node and an output node, and is couplable between a high-potential power rail and a low-potential power rail, the bus-hold circuit comprising:

a. a latching inverter having an input coupled to the output node and an output coupled to the input node;

b. a sense circuit coupled to the input node; and c. an arbiter circuit coupled to said sense circuit and to the input node, wherein said sense circuit and said arbiter circuit selectively establish in combination a pseudo power rail to power said latching inverter, wherein any potential at the input node in excess of the potential of either the high-potential power rail or the low-potential power rail is the potential of said pseudo power rail.

20. The computer system as claim in claim 19 wherein said sense circuit is coupled to the high-potential power rail and wherein said pseudo power rail is a pseudo high potential power rail having a potential that is the higher of either the potential associated with the input node or the potential associated with the high-potential power rail.

\* \* \* \* \*